United States Patent [19]
Keller

[11] 4,103,273
[45] Jul. 25, 1978

[54] METHOD FOR BATCH FABRICATING SEMICONDUCTOR DEVICES

[75] Inventor: Hans W. Keller, Excelsior, Minn.

[73] Assignee: Honeywell Inc., Minneapolis, Minn.

[21] Appl. No.: 510,279

[22] Filed: Sep. 30, 1974

Related U.S. Application Data

[60] Continuation of Ser. No. 354,589, Apr. 26, 1973, which is a division of Ser. No. 128,420, Mar. 26, 1971, Pat. No. 3,757,414.

[51] Int. Cl.² ............................................. G01L 1/22
[52] U.S. Cl. .......................................... 338/2; 29/578; 29/580; 29/583
[58] Field of Search ........................... 338/2, 5; 357/26; 73/88.5 SD; 29/576, 578, 580, 583

[56] References Cited

U.S. PATENT DOCUMENTS

| | | | |
|---|---|---|---|
| 3,139,598 | 6/1964 | Ruge | 338/4 |
| 3,401,449 | 9/1968 | Shaw | 29/578 |
| 3,417,361 | 12/1968 | Heller et al. | 338/4 X |
| 3,427,708 | 2/1969 | Schutz | 29/580 |

*Primary Examiner*—C. L. Albritton
*Attorney, Agent, or Firm*—Theodore F. Neils

[57] ABSTRACT

A method for batch fabricating semiconductor stress sensors having the semiconductor material diaphragm rigidly joined to a support flange made of the same semi-conducting material. Two processed silicon slices, one to form diaphragms and the other to form support flanges, are rigidly joined. The joined slices are then partitioned to form individual stress sensors.

31 Claims, 10 Drawing Figures

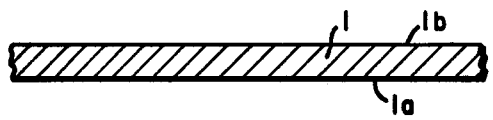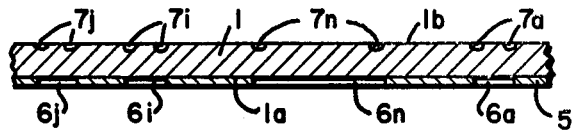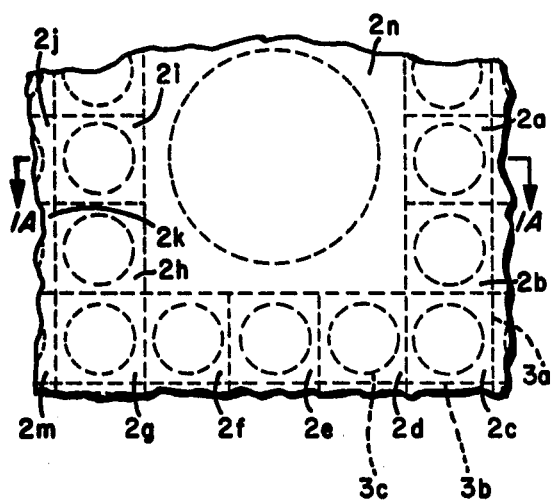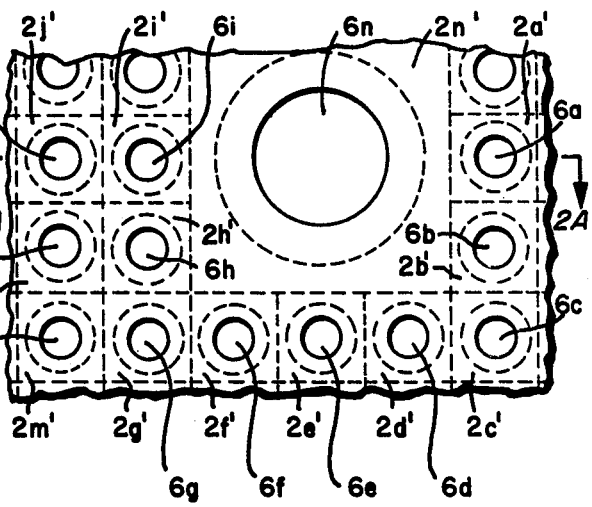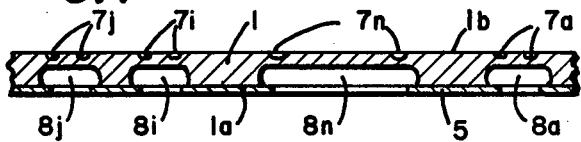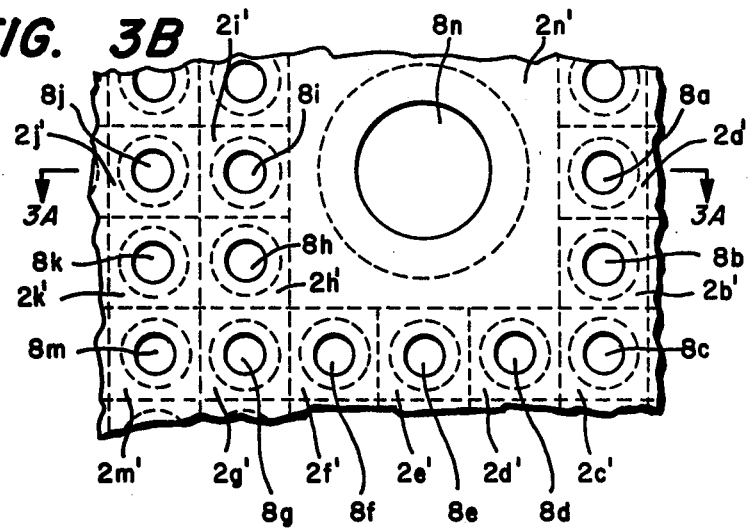

METHOD FOR BATCH FABRICATING SEMICONDUCTOR DEVICES

This is a continuation of application Ser. No. 354,589, filed Apr. 26, 1973, which in turn is a division of application Ser. No. 128,420, filed Mar. 26, 1971, now U.S. Pat. No. 3,757,414.

BACKGROUND OF THE INVENTION

Direct stress sensing by semiconductor elements has evolved recently. The element as originally introduced was a small piece of a semiconductor wafer serving as a diaphragm with electrical elements formed therein. This semiconductor diaphragm was then bonded to or mechanically coupled to a support structure which restricted motion of the periphery of the diaphragm with respect to its support structure, i.e. constrained the diaphragm by a peripheral surface in one of the diaphragm faces. However, poor bonding and differences between the thermal coefficients of expansion of the semiconductor material and the support structure material limited the accuracy of the composite structure as a stress sensor due to error stresses resulting from these coefficient differences.

It has been previously proposed that the support structure be made of the same material as the semiconductor diaphragm. Thus, the temperature coefficients of expansion in the semiconductor diaphragm and in the support structure would be equal. A method of making a stress sensor unit wherein the semiconductor diaphragm and the support flange are a single material unitary body is presented in U.S. Pat. No. 3,417,361 to H. B. Heller. It has been found that the stress sensor need not be a single material unitary body as shown in that patent if a joint between the semiconductor diaphragm and the support flange is formed by a strong bond.

Costs decrease if semiconducting material diaphragm-support structure units can be produced in a batch fabrication process. Uniformity of performance is also improved.

An object of this invention then is to provide a method to fabricate such stress sensors in a batch.

SUMMARY OF THE INVENTION

Two wafers of semiconducting material are prepared, one to a condition for forming diaphragms and the second wafer to a condition satisfactory for bonding the second wafer to the first wafer. The second wafer may also have holes through it for providing access to the diaphragms. The two wafers are then bonded together such that any holes through the second wafer substantially overlap prepared diaphragms in the first wafer. The joined wafers are then partitioned into elements each containing a recess and any associated access hole.

BRIEF DESCRIPTION OF THE DRAWING

FIGS. 1 through 6 are a diagrammatic showing of results obtained after accomplishing steps of the method of this invention to batch fabricate semiconductor stress sensors.

DESCRIPTION OF THE PREFERRED EMBODIMENTS

Figure 4A:
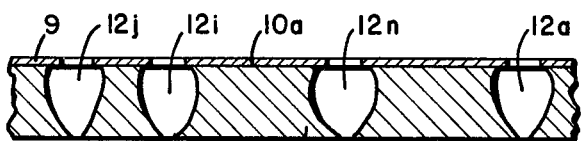

FIG. 1B shows a portion of a surface, 1a, of a first wafer of semiconductor material, 1. A section line 1A is shown on the surface. The section corresponding to section line 1A is shown in FIG. 1A. The dashed lines shown in this Figure, such as dashed circular line 3c and dashed straight lines 3a and 3b, are used to indicate the boundaries of surfaces 2a through 2n contained in major surface 1a. The surfaces 2a through 2n represent a sample selection of surfaces to be constrained. These surfaces will be constrained by bonding support structures to them as discussed below. Each of these surfaces selected to be constrained surrounds a further surface such as that contained within dashed circular line 3c of FIG. 1B through which recesses will be made. The remaining material after recessing forming the bottom of a recess serves as a diaphragm. A typical thickness of this first wafer would be 8 mils.

As a first step in the method, sets of electrical elements for each diaphragm, such as diffused resistors, may be formed by standard techniques at major surface 1b in wafer 1. Each set is to be formed at an area of surface 1b that would be enclosed by projecting circular dashed line boundaries such as 3c in surface 1a through wafer 1 onto surface 1b. The section 2A view shown in FIG. 2A shows several of these sets of electrical elements identified 7a, 7n, 7i and 7j formed through surface 1b.

The second step is to mask major surface 1a of wafer 1. This is followed by the third step of exposing surface 1a within the dashed circular line boundaries such as 3c shown in FIG. 1B. These exposures are shown in FIG. 2B as 6a through 6n. A section view of some of these exposures identified as 6a, 6n, 6i and 6j are shown in the section view 2A of FIG. 2A. Surfaces 2a through 2n, now shown masked in FIG. 2B, are redesignated 2a' through 2n'. If the bonding of the two wafers discussed below is to be done by forming an eutectic bond then the masking material 5 must be capable of forming an eutectic bond with the material of wafer 1. For this bonding method, a choice of material is silicon for wafer 1 and gold chrome for masking material 5.

The fourth step is to form recesses in the semiconductor material of wafer 1 at locations of the exposures 6a through 6n. The results are shown in FIG. 3B as recesses 8a through 8n. The recesses may be formed by any of several techniques such as machining or etching. If the masking material 5 is gold chrome or another material which will resist an etching agent that is capable of etching away the material of wafer 1, recesses 8a through 8n are easily formed by etching. The remaining material between major surface 1b and the bottom surfaces of the recesses 8a through 8n serves as diaphragms with a typical thickness of 2½ mils. These diaphragms resulting from the forming of recesses are shown in four instances 8a, 8n, 8i and 8j in the section view 3A of FIG. 3A. It is clear that the first step in this method, i.e. forming the circuit elements, could defer until after this recess forming step. This is to say elecrical element sets 7a through 7n may be formed after recesses 8a through 8n are formed. It is also clear that the electrical element set 7a through 7n could be formed at the bottom surfaces of the recesses 8a through 8n rather than where shown in the section views of FIGS. 2A and 3A.

The second, third and fourth steps clearly may be entirely omitted if wafer 1 is sufficiently thin for the material within the dashed circular lines such as 3c to serve as satisfactory diaphragms. This could be accomplished by using a thin wafer from the beginning. A thicker wafer may be used if, after it is bonded to a second wafer as discussed below, the wafer thickness is reduced such as by etching or machining.

Figure 4B:
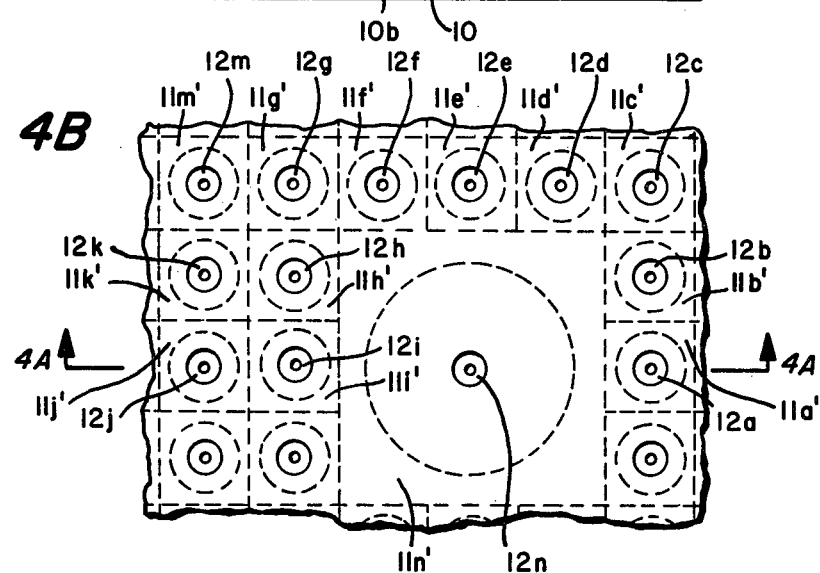

A second wafer for the support structure consisting of the same semiconducting material as in wafer 1 and containing access holes 12a through 12n in locations corresponding to the recesses in wafer 1 is shown finished in a portion of the wafer in FIG. 4B. It may be formed, as discussed in the following, nearly as is wafer 1. FIG. 4B shows surfaces 11a' through 11n' corresponding to surfaces 2a' through 2n' as would be marked out if wafer 1 was placed against wafer 2 and the boundaries of surfaces 2a' through 2n' were projected onto wafer 2. With wafer 2 positioned against wafer 1 in the above correspondence, the cross-section of access holes 12a through 12n at masked surfaces 10a would be substantially overlapped by the cross-section of recesses 8a through 8n at masked surface 1a. A typical thickness of wafer 10 is 20 mils.

The fifth step is to mask surface 10a of wafer 10 with masking material 9. The sixth step surface 10a is exposed at the locations for the access holes indicated in the paragraph above. Again, if the bonding step discussed below consists of forming an eutectic bond, masking material 9 must be capable of forming an eutectic bond with the material of wafers 1 and 10 and with the masking material 5.

The seventh step is forming access holes 12a through 12n in wafer 10. Again machining or etching are two of the several available techniques. Choosing a material for masking material 9 which will resist an etching agent that is capable of etching the material wafer 10 allows access holes 12a through 12n to be etched in wafer 10. Some of the access holes designated as 12a, 12n, 12i and 12j so formed are shown in the section view of FIG. 4A. It is clear that the fifth step of masking wafer 10 may be omitted and replaced by other access hole locating methods when using other than etching techniques to form the access holes.

Figure 5:
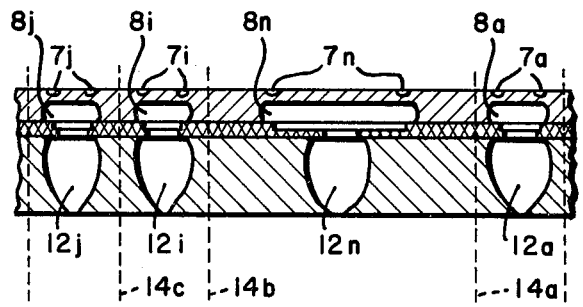

The result of the eighth step, butting a masked surface of wafer 1 against the masked surface of wafer 10 to form an interface, is shown in FIG. 5. The wafers 1 and 10 are positioned in the butting relationship such that points in the surfaces 2a' through 2n' are substantially adjacent to the corresponding points in the surfaces 11a' through 11n'.

Bonding together the wafers so butted above is the ninth step. Several bonding techniques will form a satisfactory joint. An eutectic bond which can be formed by standard techniques is particularly useful in this application since it is easily integrated with the etching techniques indicated above. As mentioned, masking materials 5 and 9 can be gold chrome and semiconducting material wafers 1 and 10 may be silicon.

It is clear that wafer 10 could also be joined to wafer 1 at surface 1b had the masking and etching occurred at major surface 10b rather than at major surface 10a. It further is clear that the forming of access holes through wafer 10 could be deferred until after bonding. The holes could then be machined in wafer 10 at the completion of bonding. Alternatively, the forming of diaphragms by recessing may be deferred until after bonding. Then the recessing may be accomplished using etching or machining techniques either through the unbonded surface of wafer 1 or through the bonded surface by operating through the access holes in wafer 2. Also it can be seen that with recesses through the bonded surface no access holes need be formed completely through wafer 10 at all if the wafers 1 and 10 are bonded together in a vacuum. In that circumstance an absolute pressure gauge will have been fabricated. If the pressures which such a gauge is to measure are large compared to atmospheric pressure, as a practical matter it is unnecessary to bond in a vacuum to effect a satisfactory gauge.

Figure 6:
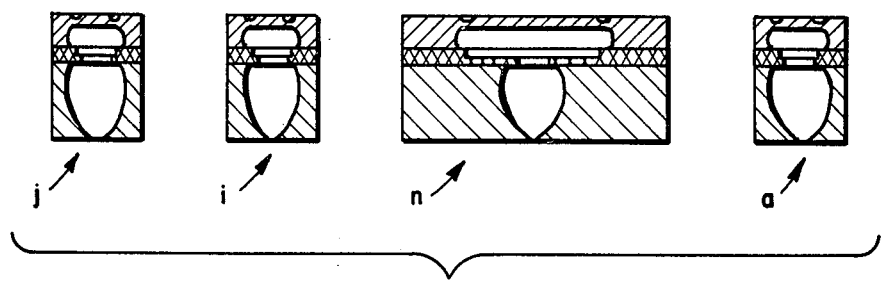

The tenth step is partitioning the now rigidly joined wafers along surfaces containing both the lines such as 14a, 14b and 14c shown in FIG. 5 and the boundaries shown as dashed straight line boundaries in FIG. 1B such as 3a and 3b. The resulting individual stress sensor elements are shown in FIG. 6. The partitioning may be effected by alternative methods such as by sawing apart the elements. It is clear that some of the partitionings along some of the boundaries shown as dashed straight line boundaries may be omitted to form multiple diaphragm units. It is also clear that wafer 1 can be partitioned at the end of the seventh step. Then corresponding pieces resulting from each of the partitionings can be bonded to make a stress sensor at a time has had its two subcomponents batch fabricated.

As has been shown in the preceding, some steps can occur alternatively at different points in the process. Such reorderings do not represent inventions differing from the invention disclosed in the specification and the claims.

The embodiments of the invention in which an exclusive property or right is claimed are defined as follows:

1. A method for batch fabricating semiconductor material stress sensors comprising:
   forming access holes at selected locations through a first major surface of a first wafer of said semiconductor material,
   bonding a second wafer of said semiconductor material to said first wafer having said access holes therein,
   forming electrical elements in said second wafer at locations corresponding to said access holes through a second major surface of said second wafer, and
   partitioning said joined wafers to form said stress sensors.

2. The method of claim 1 wherein said forming of access holes is accomplished by:
   masking said first major surface of said first wafer with a first masking material which resists a first selected etching agent,
   exposing said first major surface at said selected locations, and
   applying said first etching agent capable of etching said semiconductor material to said masked and exposed first major surface until said access holes are formed.

3. The method of claim 1 wherein said bonding is accomplished by:
   forming diaphragms by recessing in said second wafer located to correspond to said access holes in said first wafer, and
   bonding said wafers together such that said diaphragms substantially overlap said access holes.

4. The method of claim 1 wherein said bonding includes:
   bonding said wafers together, and
   forming diaphragms by recessing in said second wafer through said access holes.

5. The method of claim 1 wherein said bonding includes:
   bonding said wafers together, and reducing the thickness of said second wafer by removing material from an unbonded major surface of said second wafer.

6. The method of claim 1 wherein said forming of access holes is accomplished by machining.

7. The method of claim 1 wherein said forming of electrical elements is accomplished at an unbonded major surface of said second wafer.

8. The method of claim 2 wherein said bonding is accomplished by:
using as said masking material a material capable of forming an eutectic bond between surfaces of said semiconducting material, and
attaching said second wafer to said first major surface with said access holes by an eutectic bond.

9. The method of claim 4 wherein said recessing is accomplished by etching.

10. The method of claim 5 wherein said reducing of thickness is accomplished by etching.

11. The method of claim 5 wherein said reducing of thickness is accomplished by machining.

12. A method for batch fabricating semiconductor material stress sensors comprising:
forming access holes at selected locations through a first major surface of a first wafer of said semiconductor material,
forming electrical elements in a second wafer of said semiconductor material at locations corresponding to said access holes through a second major surface of said second wafer,
bonding said second wafer having said electrical elements therein to said first wafer having said access holes therein, and
partitioning said joined wafers to form said stress sensors.

13. The method of claim 12 wherein said bonding is accomplished by:
forming diaphragms by recessing in said second wafer located to correspond to said access holes in said first wafer through a major surface opposite said second major surface, and
bonding said wafers together such that said diaphragms substantially overlap said access holes.

14. The method of claim 12 wherein said bonding is accomplished by:
bonding said wafers together, and
forming diaphragms by recessing in said second wafer located to correspond to said access holes in said first wafer through an unbonded major surface of said second wafer.

15. A method for batch fabricating semiconductor material stress sensors comprising:
bonding a first wafer of said semiconductor material to a second wafer of said semiconductor material,
forming access holes at selected locations through a first major surface of said first wafer opposite a surface thereof to which said second wafer is attached,
forming electrical elements in said second wafer at locations corresponding to said access holes through a second major surface of said second wafer opposite a surface thereof to which said first wafer is attached, and
partitioning said joined wafers to form said stress sensors.

16. The method of claim 15 wherein said forming of said access holes includes:
forming said access holes, and
forming diaphrahms by recessing in said second wafer through said access holes.

17. A method for batch fabricating semiconductor material stress sensors comprising:
forming sets of electrical elements in a first wafer of said semiconductor material at selected locations through a first major surface of said first wafer,
bonding said first wafer to a second wafer of said semiconductor material,
forming access holes in said second wafer at locations corresponding to said sets of electrical elements through a second major surface of said second wafer opposite a surface thereof to which said first wafer is attached, and
partitioning said joined wafers to form said stress sensors.

18. The method claim 17 wherein said forming of access holes includes forming diaphragms by recessing in said first wafer.

19. The method of manufacturing a plurality of semiconductor transducers simultaneously which comprises
forming a plurality of holes in a first wafer of semiconductor material;
forming a plurality of strain sensitivity electrical components on a selected surface of a second wafer of semiconductor material;
joining in proper alignment said first wafer of semiconductor material and said second wafer of semiconductor material such that said second wafer of semiconductor material covers the holes in said first wafer of semiconductor material in a selected manner.

20. Structure which comprises:
a first semiconductor wafer with a first surface and a second surface and a plurality of holes formed in said first surface;
a second semiconductor wafer containing a first surface and a second surface;
means joining said first wafer to said second wafer and
a plurality of strain sensitive electrical components formed on a selected surface of said two wafers in cooperating relationship to said plurality of holes.

21. Structure as in claim 20 wherein said strain sensitive electrical components are formed on said first surface of said second wafer.

22. Structure as in claim 20 wherein said plurality of strain sensitive electrical components are formed on said second surface of said second wafer.

23. Structure as in claim 20 wherein said plurality of strain sensitive electrical components are formed on said second surface of said first wafer.

24. Structure as in claim 20 wherein said plurality of holes extend part way through said first wafer.

25. Structure as in claim 20 wherein said plurality of holes extend completely through said first wafer.

26. Structure as in claim 20 wherein said plurality of strain sensitive electrical components are formed on said selected surface in a position such that maximum electrical signal is generated for a given deflection of said selected surface.

27. Structure as in claim 20 wherein a vacuum exits in each of said holes.

28. Structure as in claim 20 wherein each of said holes contains a selected reference pressure.

29. A semiconductor transducer comprising a first portion of a semiconductor material containing therein a hole;

a second portion of semiconductor material placed over the top of said hole, said hole containing a selected reference pressure; and strain sensitive electrical components formed on the bottom surface of said first portion of semiconductor material so as to be responsive to variations in pressures incident upon said transducer.

30. Structure as in claim 29 wherein said selected reference pressure is a vacuum.

31. A semiconductor pressure transducer formed from the structure of claim 20 comprising a strain sensitive electrical component and a hole formed by subdividing the said two semiconductor wafers of claim 35 into individual units, each of which contains one of said strain sensitive electrical components and one hole.

* * * * *